(12) United States Patent
Tseng et al.

(10) Patent No.: US 11,600,562 B2
(45) Date of Patent: Mar. 7, 2023

(54) SEMICONDUCTOR PACKAGES AND METHOD OF MANUFACTURING THE SAME

(71) Applicant: Taiwan Semiconductor Manufacturing Company, Ltd., Hsinchu (TW)

(72) Inventors: Shu-Jung Tseng, Taichung County (TW); Fu-Jen Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 227 days.

(21) Appl. No.: 17/075,700

(22) Filed: Oct. 21, 2020

(65) Prior Publication Data
US 2022/0122909 A1    Apr. 21, 2022

(51) Int. Cl.
*H01L 23/498* (2006.01)
*H01L 21/48* (2006.01)
(Continued)

(52) U.S. Cl.
CPC .... *H01L 23/49861* (2013.01); *H01L 21/4846* (2013.01); *H01L 21/56* (2013.01); *H01L 21/563* (2013.01); *H01L 23/3121* (2013.01); *H01L 23/49811* (2013.01); *H01L 2225/06548* (2013.01); *H01L 2225/107* (2013.01)

(58) Field of Classification Search
CPC ............... H01L 21/4846; H01L 21/563; H01L 23/3121; H01L 23/49816; H01L 2225/06548; H01L 21/56; H01L 23/49811; H01L 24/13; H01L 24/16; H01L 24/81; H01L 25/16; H01L 2224/16235; H01L 2224/81191; H01L 2224/81895; H01L 2224/16225; H01L 2225/107; H05K 2201/09036; H05K 2201/09745;
(Continued)

(56) References Cited

U.S. PATENT DOCUMENTS 8,993,380 B2   3/2015   Hou et al.
9,281,254 B2   3/2016   Yu et al.
(Continued)

FOREIGN PATENT DOCUMENTS

TW   201935582   9/2019
TW   201935630   9/2019
(Continued)

OTHER PUBLICATIONS

"Office Action of Taiwan Counterpart Application", dated Sep. 29, 2021, p. 1-p. 4.
(Continued)

*Primary Examiner* — Jose R Diaz
(74) *Attorney, Agent, or Firm* — JCIPRNET

(57) ABSTRACT

A semiconductor package includes an interposer, a die, a protective layer, a plurality of first electrical connectors and a first molding material. The die includes a first surface and a second surface opposite to the first surface, and the die is bonded to the interposer through the first surface. The protective layer is disposed on the second surface of the die. The first electrical connectors are disposed aside the die. The first molding material is disposed aside the die, the protection layer and the first electrical connectors.

20 Claims, 13 Drawing Sheets

(51) Int. Cl.
*H01L 21/56* (2006.01)
*H01L 23/31* (2006.01)

(58) Field of Classification Search
CPC .... H05K 2201/09072; H05K 2201/10–10007;
H05K 2201/10159; H05K 2201/10166
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2014/0217610 | A1* | 8/2014 | Jeng .................... H01L 21/4857 257/774 |
| 2017/0092617 | A1 | 3/2017 | Wu et al. |
| 2017/0213808 | A1 | 7/2017 | Pan et al. |
| 2020/0006232 | A1 | 1/2020 | Pietambaram et al. |

FOREIGN PATENT DOCUMENTS

| | | |
|---|---|---|
| TW | 201939685 | 10/2019 |
| TW | 202002227 | 1/2020 |
| TW | 202008546 | 2/2020 |

OTHER PUBLICATIONS

"Office Action of Taiwan Counterpart Application", dated Nov. 24, 2021, p. 1-p. 5.

* cited by examiner

SEMICONDUCTOR PACKAGES AND METHOD OF MANUFACTURING THE SAME

BACKGROUND

In recent years, the semiconductor industry has experienced rapid growth due to continuous improvement in integration density of various electronic devices, e.g., transistors, diodes, resistors, capacitors, etc. For the most part, this improvement in integration density has come from successive reductions in minimum feature size, which allows more devices to be integrated into a given area.

These smaller electronic devices also require smaller packages that occupy less area than previous packages. One of the promising semiconductor packages is a "chip on wafer on substrate (CoWoS)" structure for advanced products targeting cloud computing, data center, and super computer applications. Although the existing semiconductor packages have been generally adequate for their intended purposes, they have not been entirely satisfactory in all respects.

DETAILED DESCRIPTION

Figure 1A:
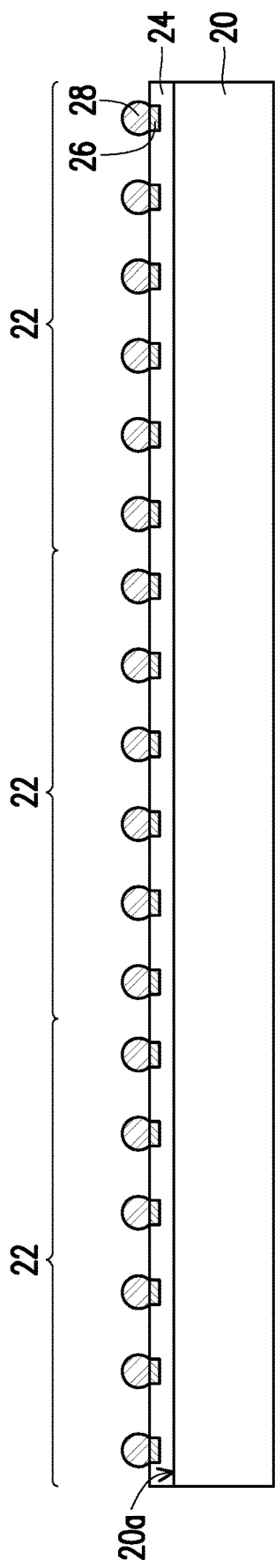
FIG. 1A to FIG. 1D are schematic cross-sectional views of various stages in a method of forming a die according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross-sectional views of various stages in a method of forming a die according to some embodiments.

Referring to FIG. 1A, a semiconductor wafer 20 is provided. In some embodiments, the semiconductor wafer 20 includes any number of dies 22. The semiconductor wafer 20 may include a bulk semiconductor substrate, a semiconductor-on-insulator (SOI) substrate, or the like. The semiconductor material of the semiconductor wafer 20 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor wafer 20 may be doped or undoped. The semiconductor wafer 20 may include a wide variety of active devices and passive devices such as capacitors, resistors, inductors and the like that may be used to generate the desired structural and functional requirements of the design for the dies 22. The active devices and passive devices may be formed using any suitable methods either within or else on an active surface 20a of the semiconductor wafer 20.

An interconnect structure 24 including one or more dielectric layer(s) and respective metallization pattern(s) is formed on the active surface 20a. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like.

In some embodiments, bond pads 26 are electrically connected to the interconnect structure 24, and electrical connectors 28 are formed and electrically connected to the bond pads 26 to provide an external electrical connection to the circuitry and devices. In some embodiments, the electrical connectors 28 are utilized when bonding the dies 22 to other structures. The electrical connectors 28 may be controlled collapse chip connection (C4) bumps, solder balls such as a ball grid array (BGA), metal pillars, electroless nickel-electroless palladium-immersion gold technique (ENEPIG) formed bumps, or the like. The electrical connectors 28 include a conductive material such as solder, copper, aluminum, gold, nickel, silver, palladium, tin, the like, or a combination thereof. In an embodiment in which the electrical connectors 28 are solder bumps, the electrical connectors 28 are formed by initially forming a layer of solder on the bond pads 26 through various methods such as evaporation, electroplating, printing, solder transfer, ball placement, or the like. In this embodiment, once a layer of solder has been formed on the bond pads 26, a reflow is performed to shape the material into the desired bump shape. In another embodiment, the electrical connectors 28 are metal pillars (such as a copper pillars) formed by a sputtering, printing, electro plating, electroless plating, CVD, or the like. In an embodiment, the metal pillars are solder free and have substantially vertical sidewalls. In some embodiments, a metal cap layer (not shown) is formed on the top of the metal pillar electrical connectors 28. In some embodiments, the metal cap layer includes nickel, tin, tin-lead, gold, silver, palladium, indium, nickel-palladium-gold, nickel-gold, the like, or a combination thereof and is formed by a plating process. One of ordinary skill in the art will appreciate that the above examples are provided for illustrative purposes. Other circuitry may be used as appropriate for a given application.

Figure 1B:
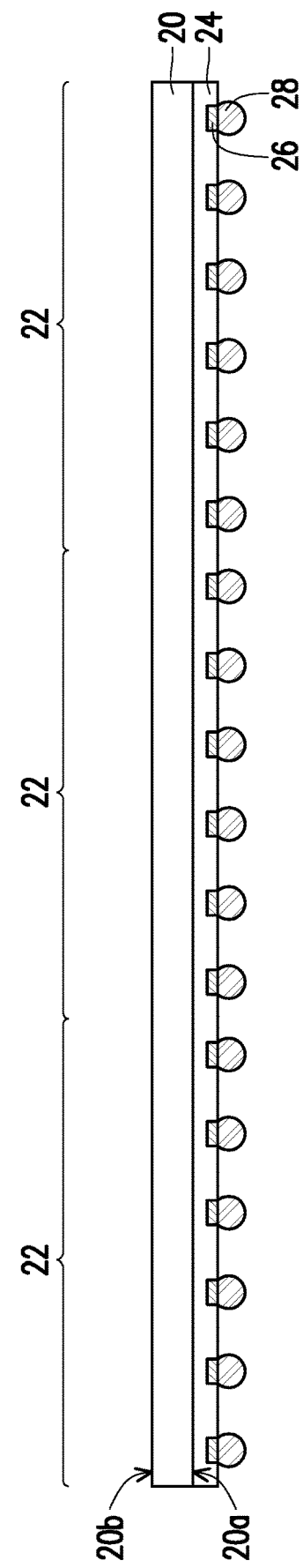

Referring to FIG. 1B, a thinning process is performed on a surface 20b of the semiconductor wafer 20 to thin the semiconductor wafer 20. The surface 20b is disposed opposite to the active surface 20a. The active surface 20a may be a front side surface, and the surface 20b may be a backside surface. The thinning process may include an etching process, a grinding process, the like, or a combination thereof. In some embodiments, after the thinning process, the semiconductor wafer 20, the interconnect structure 24 and the electrical connectors 28 have a combined thickness in a range from about 100 μm to about 300 μm.

Figure 1C:
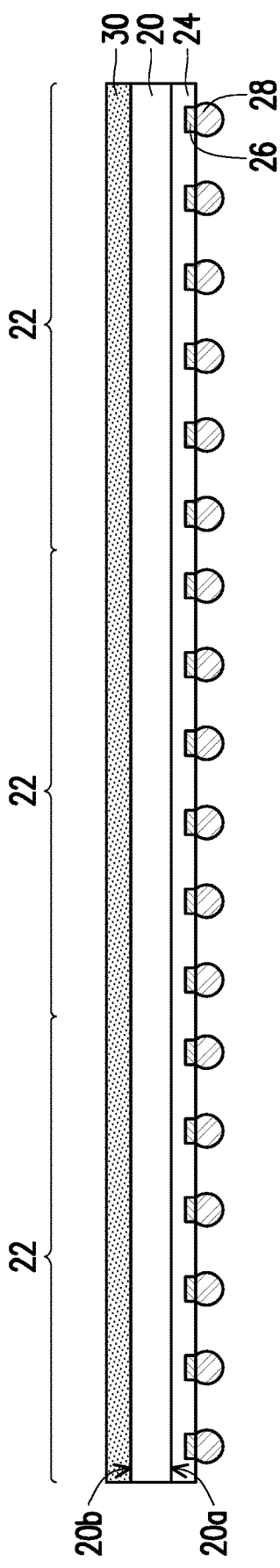

Referring to FIG. 1C, a protective material 30 is formed on the surface 20b of the semiconductor wafer 20. In some embodiments, the protective material 30 covers the surface 20b of the semiconductor wafer 20 entirely. The protective material 30 may be an electrically insulative material, such as a glue, an adhesive, the like, or a combination thereof. The material of the protective material 30 may include an epoxy resin, a phenol resin, acrylic rubber, silica filler, the like, or a combination thereof. The protective material 30 may be in direct contact with the surface 20b of the wafer (e.g., in direct contact with a semiconductor material of the wafer). The protective material 30 may be formed by a coating process, a lamination process, the like, or a combination thereof.

Figure 1D:
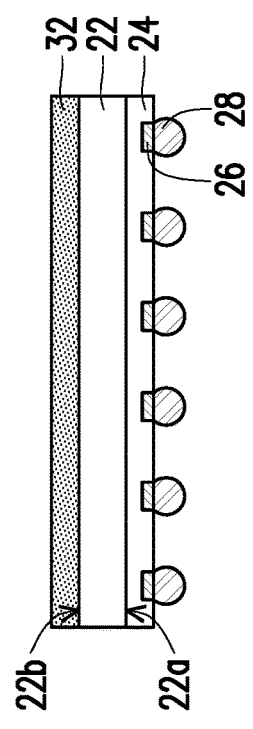

Referring to FIG. 1D, the semiconductor wafer 20 with the protective material 30 thereon is singulated into individual dies 22 and individual protective layers 32. The singulation may include sawing, dicing, or the like. Typically, the dies 22 contain the same circuitry, such as devices and metallization patterns, although the dies 22 may have different circuitry. Each of the dies 22 may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 22 are different sizes (e.g., different heights and/or surface areas), and in other embodiments, the dies 22 are the same size (e.g., same heights and/or surface areas).

The die 22 has an active surface 22a and a surface 22b opposite to the active surface 22a. The active surface 22a may be a front side surface, and the surface 22b may be a backside surface. Each die 22 has the protective layer 32 on the surface 22b. A ratio of a size of the protective layer 32 to a size of the die 22 may be in a range of about 1.1 to about 0.95. In an embodiment, the size of the protective layer 32 is a projection area onto the interposer 102 (as shown in FIG. 2C), and the size of the die 22 is a projection area onto the interposer 102 (as shown in FIG. 2C). In an embodiment, the protective layer 32 is formed on an entirety of the surface 22b of the die 22. In such embodiment, a sidewall of the protective layer 32 is substantially flush with a sidewall of the die 22. In some embodiments, the die 22 has the protective layer 32 on its surface 22b, and thus the surface 22b of the die 22 is prevented from being damaged.

Figure 2A:
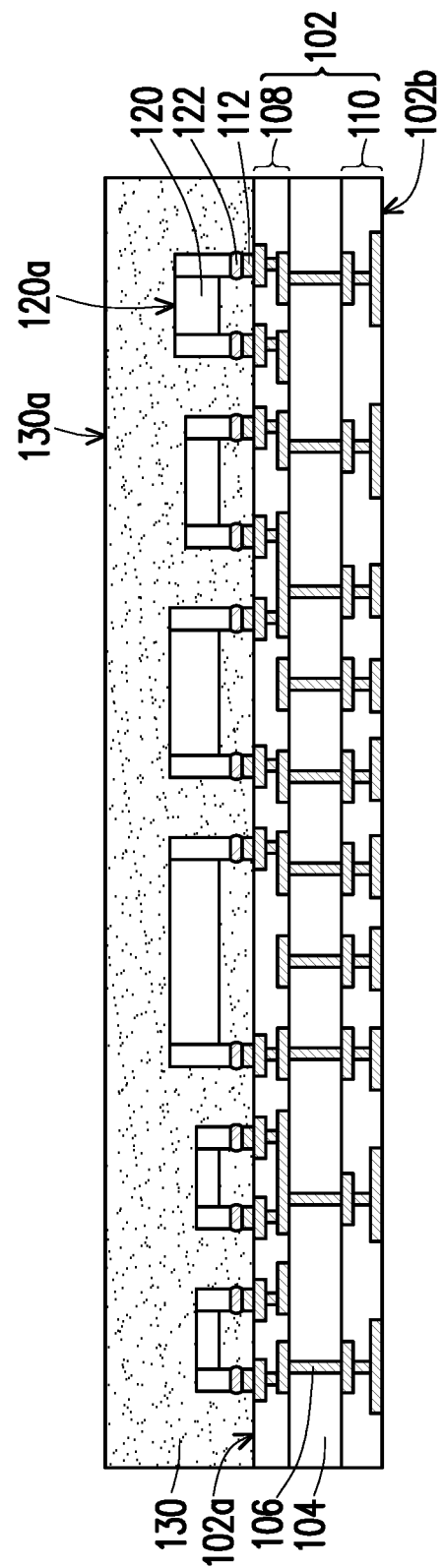
FIG. 2A to FIG. 2H are schematic cross-sectional views of various stages in a method of manufacturing a semiconductor package according to some embodiments.
Figure 2B:
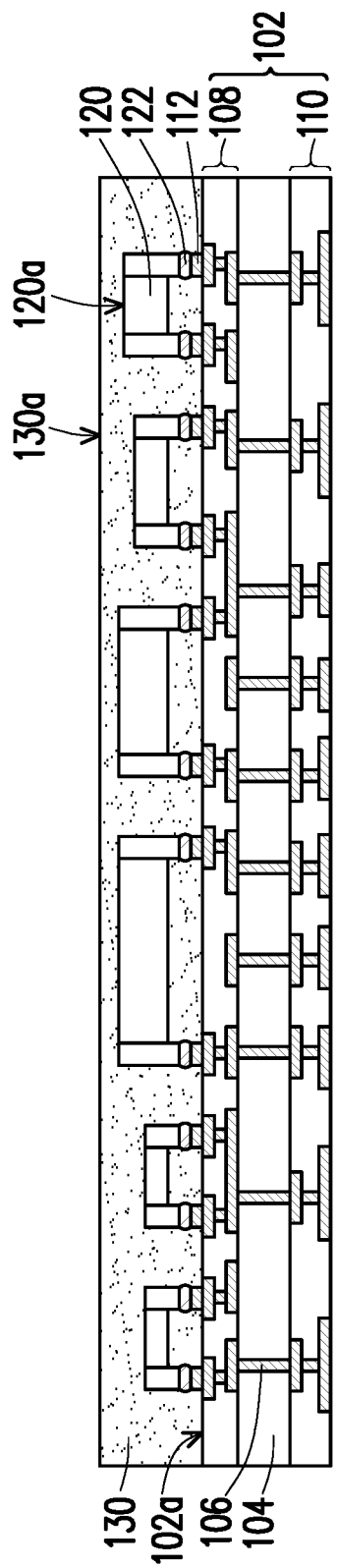
Figure 2C:
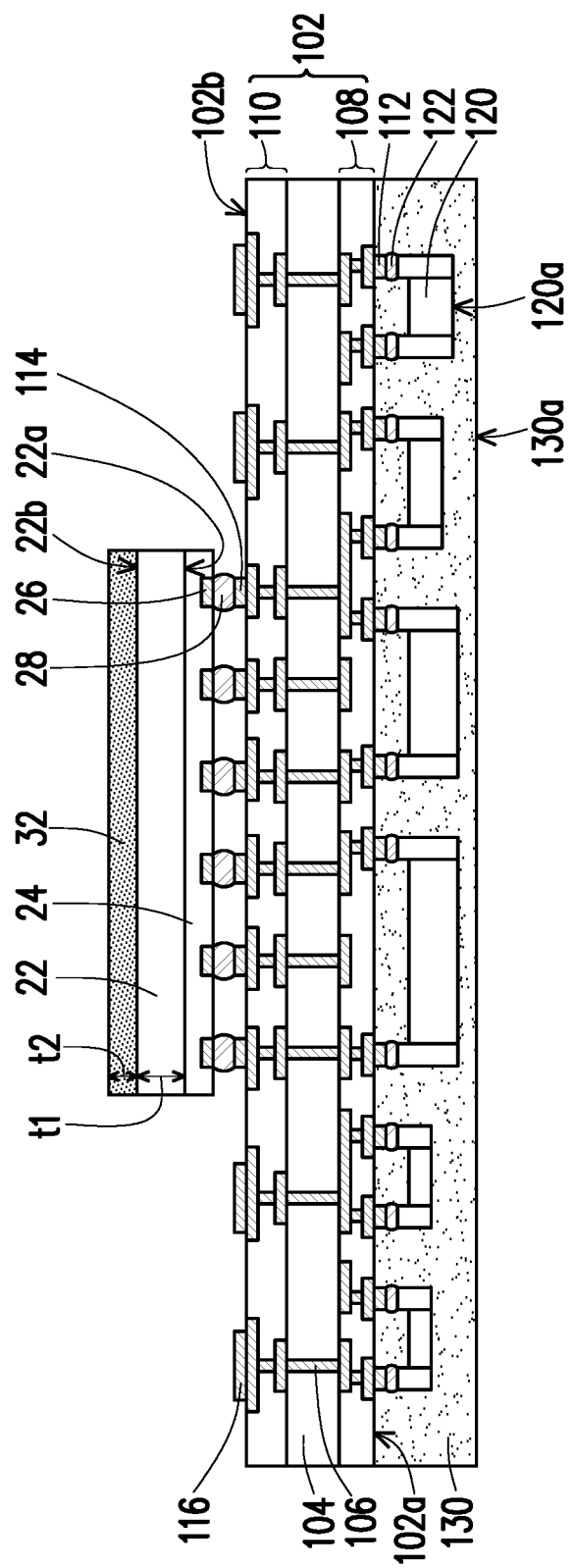
Figure 2D:
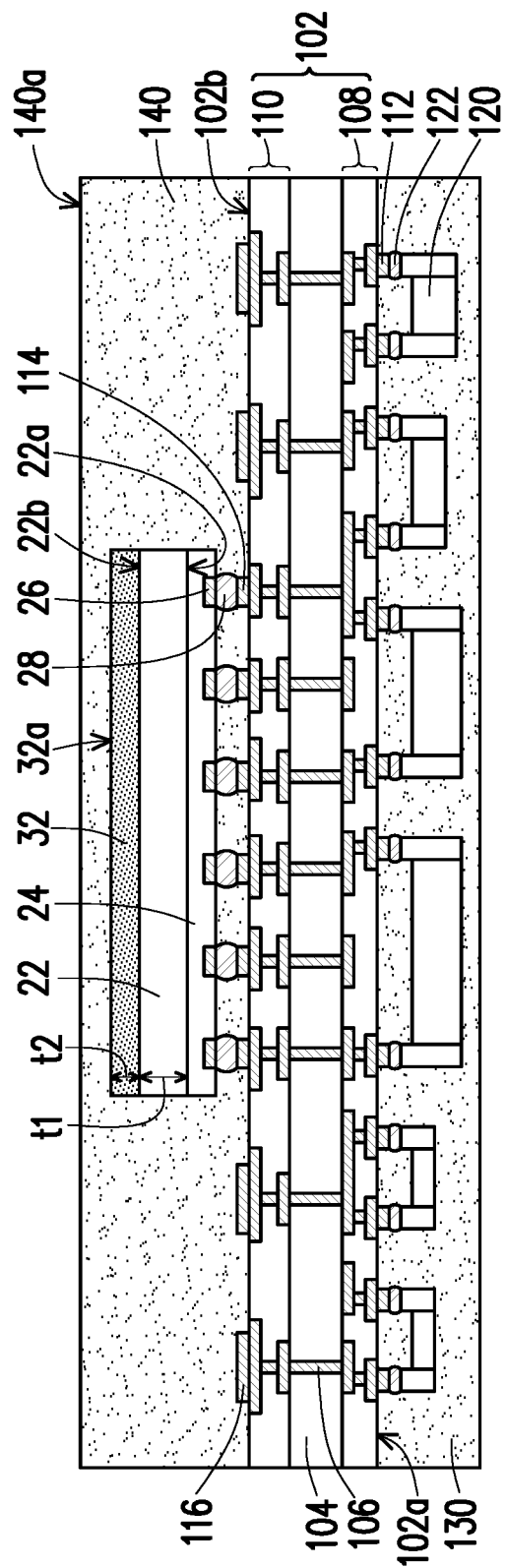
Figure 2E:
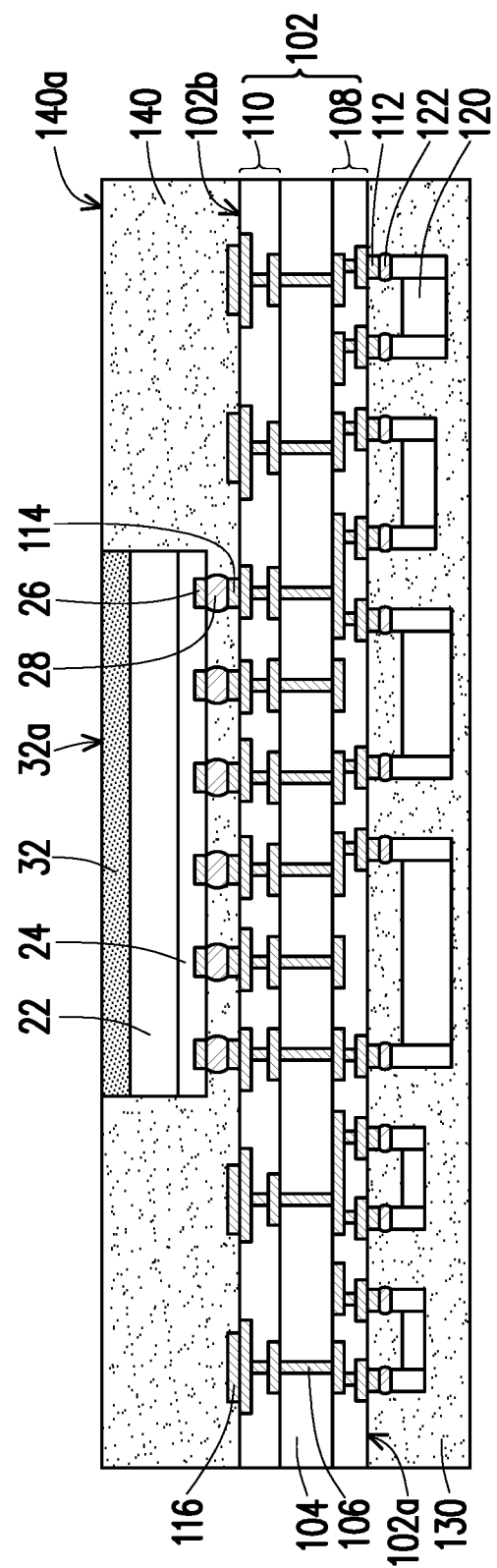
Figure 2F:
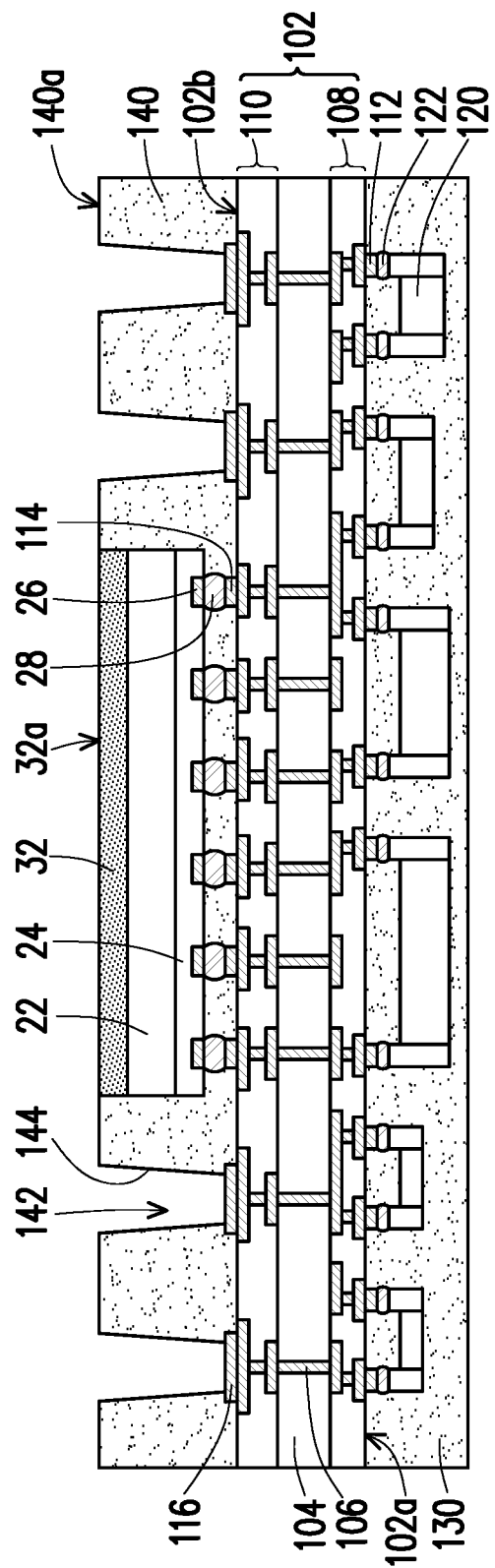
Figure 2G:
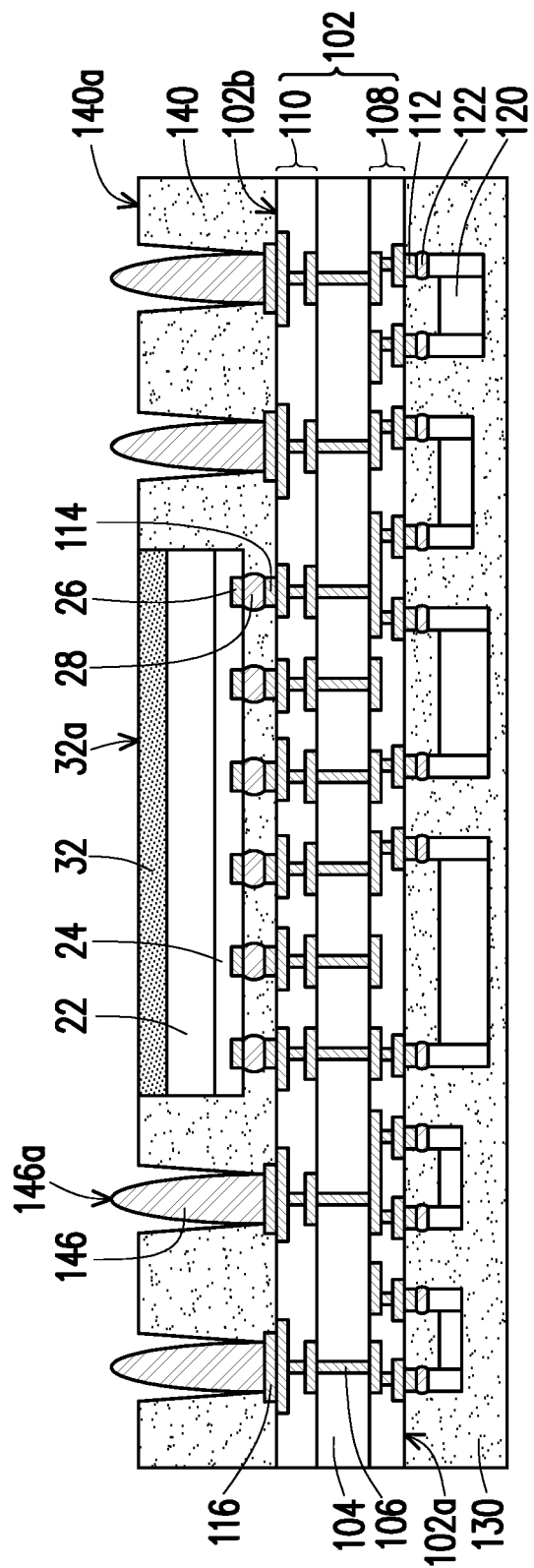

FIG. 2A to FIG. 2H are schematic cross-sectional views of various stages in a method of manufacturing a semiconductor package according to some embodiments. FIG. 3 is a schematic top view of a semiconductor package in accordance with some embodiments. For simplicity and clarity of illustration, only few elements are shown in the top view of FIG. 3. In some embodiments, FIG. 2G is a cross-sectional view of a semiconductor package along the line I-I of FIG. 3.

Referring to FIG. 2A, an interposer 102 is provided. The interposer 102 may include a substrate 104, a plurality of through vias 106, and redistribution structures 108, 110. In some embodiments, the substrate 104 is made of an elemental semiconductor such as silicon, germanium, diamond, or the like. In other embodiments, the substrate 104 is made of a compound semiconductor such as silicon germanium, silicon carbide, gallium arsenic, indium arsenide, indium phosphide, silicon germanium carbide, gallium arsenic phosphide, gallium indium phosphide, the like, or a combination thereof. In an embodiment, the substrate 104 is a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In alternative embodiments, the substrate 104 is made of prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, the like, or a combination thereof.

The through vias 106 penetrate through the substrate 104. In some embodiments, the through vias 106 are made of a conductive material such as aluminum, titanium, copper, nickel, tungsten, an alloy thereof, the like, or a combination thereof. The redistribution structures 108, 110 are disposed on two sides the substrate 104 and are electrically connected to the through vias 106. The redistribution structures 108, 110 are formed to connect various devices to form functional circuitry. The redistribution structures 108, 110 include a plurality of dielectric layers and a plurality of conductive patterned layers stacked alternately. The dielectric layers may include silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof. In some embodiments, the dielectric layers are deposited by chemical vapor deposition (CVD), physical vapor deposition (PVD), atomic layer deposition (ALD), a spin-on-dielectric process, the like, or a combination thereof. The conductive patterned layers may include a metal or metal alloy including copper, aluminum, copper, tungsten, the like, or a combination thereof. In some embodiments, the conductive patterned layers are formed by deposition, damascene, dual damascene, or the like.

In some embodiments, the interposer 102 is an active interposer that contains at least one functional device or integrated circuit device. Such active interposer is referred to as a "device-containing interposer" in some examples. In some embodiments, the functional device includes an active device, a passive device, or a combination thereof. The functional device may include transistors, capacitors, resistors, diodes, photodiodes, fuse devices the like, or a combination thereof. In some embodiments, the functional device includes a gate dielectric layer, a gate electrode, source/drain regions, spacers, and the like. In alternative embodiments, the interposer 102 is a passive interposer, which is used to convey a lack of a functional device or integrated circuit device. Such passive interposer is referred to as a "device-free interposer" in some examples.

In some embodiments, one or more surface devices 120 are formed on the interposer 102. The surface devices 120 may be mounted onto the redistribution structure 108 through electrical connectors 122 and bond pads 112. The bond pads 112 electrically couple the subsequently bonded surface devices 120 to the redistribution structure 108. In some embodiments, the bond pads 112 include a thin seed layer (not shown) deposited over the interposer 102, such as by PVD, CVD, ALD, the like, or a combination thereof. The seed layer is made of copper, titanium, nickel, gold, the like, or a combination thereof. In some embodiments, the conductive material of the bond pads 112 is deposited over the thin seed layer. In some embodiments, the conductive material is formed by an electro-chemical plating process, CVD, ALD, PVD, the like, or a combination thereof. In an embodiment, the conductive material of the bond pads 112 is copper, tungsten, aluminum, silver, gold, the like, or a combination thereof.

In an embodiment, the bond pads 112 are UBMs and include three layers of conductive materials, such as a layer of titanium, a layer of copper, and a layer of nickel. However, many suitable arrangements of materials and layers for the formation of the UBMs are within the contemplated scope of the present disclosure. For example, such arrangements include an arrangement of chrome/chrome-copper alloy/copper/gold, an arrangement of titanium/titanium tungsten/copper, an arrangement of copper/nickel/gold, or the like that are suitable. Further, any suitable materials or layers of material that may be used for the UBM are also within the contemplated scope of the current application.

After the bond pads 112 are formed, the surface devices 120 that has the electrical connectors 122 are bonded to a surface 102a of the interposer 102 by way of the electrical connectors 122 and the bond pads 112. The surface devices 120 may be used to provide additional functionality or programming to the package structure to be formed. In an embodiment, the surface devices 120 include surface mount devices (SMDs) or integrated passive devices (IPDs), and the IPDs include passive devices such as resistors, inductors, capacitors, jumpers, the like that are desired to be connected to and utilized in conjunction with the package structure, or a combination thereof. The surface devices 120 may have different sizes such as height, width, or combinations thereof. In an embodiment, as shown in FIG. 2A, the surface devices 120 having a larger size are disposed on a central region of the interposer 102 and surrounded by the surface devices 120 having a smaller size. However, the disclosure is not limited thereto.

The electrical connectors 122 are bonded to contacts or electrodes on the surface devices 120. The electrical connectors 122 may be controlled collapse chip connection (C4) bumps, solder balls such as a ball grid array (BGA), metal pillars, electroless nickel-electroless palladium-immersion gold technique (ENEPIG) formed bumps, or the like. The electrical connectors 122 include a conductive material such as solder, copper, aluminum, gold, nickel, silver, palladium, tin, the like, or a combination thereof. In an embodiment in which the electrical connectors 122 are solder bumps, the electrical connectors 122 are formed by initially forming a layer of solder on the bond pads 112 through various methods such as evaporation, electroplating, printing, solder transfer, ball placement, or the like. In this embodiment, once a layer of solder has been formed on the bond pads 112, a reflow is performed to shape the material into the desired bump shape. In some embodiments, the bonding between the surface devices 120 and the interposer 102 is a solder bonding. In an embodiment, the surface devices 120 are bonded to the interposer 102 by a reflow process. During this reflow process, the electrical connectors 122 are in contact with the bond pads 112 and the surface devices 120 to physically and electrically couple the surface devices 120 to the interposer 102.

After the surface devices 120 are placed, a molding material 130 is molded on and around the surface devices 120. The molding material 130 fills the gaps between the surface devices 120. In an embodiment, the molding material 130 is formed, and fills the gaps between the surface devices 120 and the redistribution structure 108. In some embodiments, the molding material 130 is made of a molding compound, a molding underfill, an epoxy, a resin, the like, or a combination thereof. In some embodiments, a mold chase (not shown) is provided and the mold chase retains and shapes the molding material 130 during application and curing. For example, the mold chase has a border or other feature for retaining the molding material 130 when applied. The mold chase may include a release film to assist in parting the mold chase from the molding material 130. For example, the release film is used in embodiments where the molding material 130 is an epoxy or resin to prevent the molding compound material from adhering to the mold chase surface. A thickness of the molding material 130 may be adjusted based on the mold chase and the height of the surface devices 120. In an embodiment, the molding material 130 has a thickness of between about 700 µm and about 800 µm. In some embodiments, a surface 130a of the molding material 130 is higher than surfaces 120a of the surface devices 120. That is, the molding material 130 may cover the surfaces 120a of the surface devices 120.

Referring to FIG. 2B, the molding material 130 is partially removed to a required thickness. In an embodiment, a thinning process such as a grinding process is performed to thin the molding material 130, until a required thickness is obtained without exposing the surfaces 120a of the surface devices 120. The molding material 130 may cover the surfaces 120a of the surface devices 120. In some embodiments, the molding material 130 undergoes a pressure molding process by a pressure plate or mold (not shown) to shape the molding material 130. In some embodiments, the molding material 130 has a thickness in a range of 400 µm to 500 µm after the thinning process.

Referring to FIG. 2C, the interposer 102 having the surface devices 120 and the molding material 130 thereover is turned upside down. Then, the die 22 with the protective layer 32 thereon is bonded to the interposer 102. In some embodiments, the die 22 of FIG. 1D is picked and placed onto a surface 102b of the interposer 102. The die 22 is bonded to the interposer 102 through the electrical connectors 28 and bond pads 114. The bond pads 114 electrically couple the subsequently bonded die 22 to the redistribution structure 110. In some embodiments, bond pads 116 are formed to electrically couple the subsequently bonded electrical connectors 146 (as shown in FIG. 2G) to the redistribution structure 110. In an embodiment, the bond pads 116 are formed simultaneously with the bond pads 114. The bond pads 114, 116 may be similar to the bond pads 112 described above and the description is not repeated herein, although the bond pads 112, 114 and 116 are not necessarily the same.

In some embodiments, the bonding between the die 22 and the interposer 102 is a solder bonding or a direct metal-to-metal bonding, such as a copper-to-copper or tin-to-tin bonding. In an embodiment, the die 22 is bonded to the interposer 102 by a reflow process. During this reflow process, the electrical connectors 28 are in contact with the bond pads 114 and the die 22 to physically and electrically couple the die 22 to the interposer 102.

In some embodiments, a ratio of the size (e.g., a projection area onto the interposer 102) of the protective layer 32 to a size (e.g., an area of the surface 102b of the interposer 102) of the interposer 102 is in a range of about 0.5 to about 0.9. In such embodiments, as shown in FIG. 3, the area of the protective layer 32 is equal to a product of a width W1 and a length L1 of the protective layer 32, and the area of the surface 102b of the interposer 102 is equal to a product of a width W2 and a length L2 of the interposer 102. In some embodiments, the die 22 is disposed on a central region of the surface 102b of the interposer 102. That is, a horizontal distance d1 between a first sidewall S1 of the die 22 and a first sidewall S1' of the interposer 102 is substantially the same as a horizontal distance d1' between a second sidewall S2 opposite to the first sidewall S1 of the die 22 and a second sidewall S2' opposite to the first sidewall S1' of the interposer 102. Similarly, a horizontal distance d2 between a third sidewall S3 of the die 22 and a third sidewall S3' of the interposer 102 is substantially the same as a horizontal distance d2' between a fourth sidewall S4 opposite to the third sidewall S3 of the die 22 and a fourth sidewall S4' opposite to the third sidewall S3' of the interposer 102. However, the disclosure is not limited thereto.

The die 22 has a thickness t1, and the protective layer 32 has a thickness t2. The thickness t1 may be a thickness of the die 22 (as shown in FIG. 2C) or a total thickness of the die 22 and the electrical connectors 28 thereon. In some embodiments, a ratio of the thickness t2 of the protective layer 32 to the thickness t1 of the die 22 is in a range of about 5% and about 50%. In an embodiment the thickness t1 is not larger than 80 μm, the thickness t2 is not larger than 30 μm. In an embodiment, the thickness t1 of the die 22 is in a range of about 100 μm to about 300 μm, and the thickness t2 is in a range of about 5 μm to about 50 μm.

Referring to FIG. 2D, after the die 22 is bonded, a molding material 140 is molded on and around the die 22. The molding material 140 encapsulates the die 22 and fills the gaps between the electrical connectors 28. In an embodiment, the molding material 140 is formed, and fills the gaps between the die 22 and the redistribution structure 110. In some embodiments, the molding material 140 is made of a molding compound, a molding underfill, an epoxy, a resin, the like, or a combination thereof. The molding material 140 may be similar to the molding material 130 described above and the description is not repeated herein, although the molding material 130 and 140 are not necessarily the same. A thickness of the molding material 140 may be adjusted based on the mold chase and the height of the die 22. In an embodiment, the molding material 140 has a thickness of between about 400 μm and about 500 μm. In some embodiments, a surface 140a of the molding material 140 is higher than a surface 32a of the protective layer 32. In other words, the molding material 140 covers the surface 32a of the protective layer 32.

Referring to FIG. 2E, the molding material 140 is partially removed to expose the protective layer 32. In an embodiment, a thinning process such as a grinding process is performed to thin the molding material 140, until a surface 140a of the molding material 140 is substantially coplanar with the surface 32a of the protective layer 32. In an embodiment the protective layer 32 is substantially not removed by the thinning process, the molding material 140 has a thickness substantially equal to a total of the thickness t1 of the die 22 and the thickness t2 of the protective layer 32 after the thinning process. In alternative embodiments, the protective layer 32 is partially removed by the thinning process while the die 22 remains intact without being removed. During the thinning process, the die 22 is protected by the protective layer 32 from being damaged. Accordingly, the formation of grinding marks on the surface 22b of the die 22 caused by the thinning process is prevented, and the die strength is enhanced.

Referring to FIG. 2F, a plurality of openings 142 are formed in the molding material 140 to expose the bond pads 116. In some embodiments, the openings 142 are formed by a laser ablation or drilling process, an etching process, the like, or a combination thereof. The openings 142 may have sidewalls 144 which are non-perpendicular and non-parallel to the surface 102b of the interposer 102, and the sidewalls 144 may be diverging from each other.

Referring to FIG. 2G, a plurality of electrical connectors 146 are formed in the openings 142 to electrically connect to the bond pads 116. In an embodiment the electrical connectors 146 are a ball grid array (BGA) which includes a eutectic material such as solder, although any suitable materials may alternatively be used. In an embodiment in which the electrical connectors 146 are solder bumps, the electrical connectors 146 are formed using a ball drop method, such as a direct ball drop process. In another embodiment, the solder bumps are formed by initially forming a layer of tin through any suitable method such as evaporation, electroplating, printing, solder transfer, and then performing a reflow in order to shape the material into the desired bump shape. In some embodiments, the electrical connectors 146 are protruded from the molding material 140. For example, surfaces 146a of the electrical connectors 146 are higher than the surface 32a of the protective layer 32. In alternative embodiments, the electrical connectors 146 are formed by multiple steps. In detail, first electrical connectors (not shown) are formed on the bond pads 116, and the molding material 140 is formed and patterned to expose the first electrical connectors. Then, second electrical connectors are formed on the first electrical connectors, and the second electrical connectors are jointed with the first electrical connectors through a reflow process to form the electrical connectors 146.

Figure 2H:
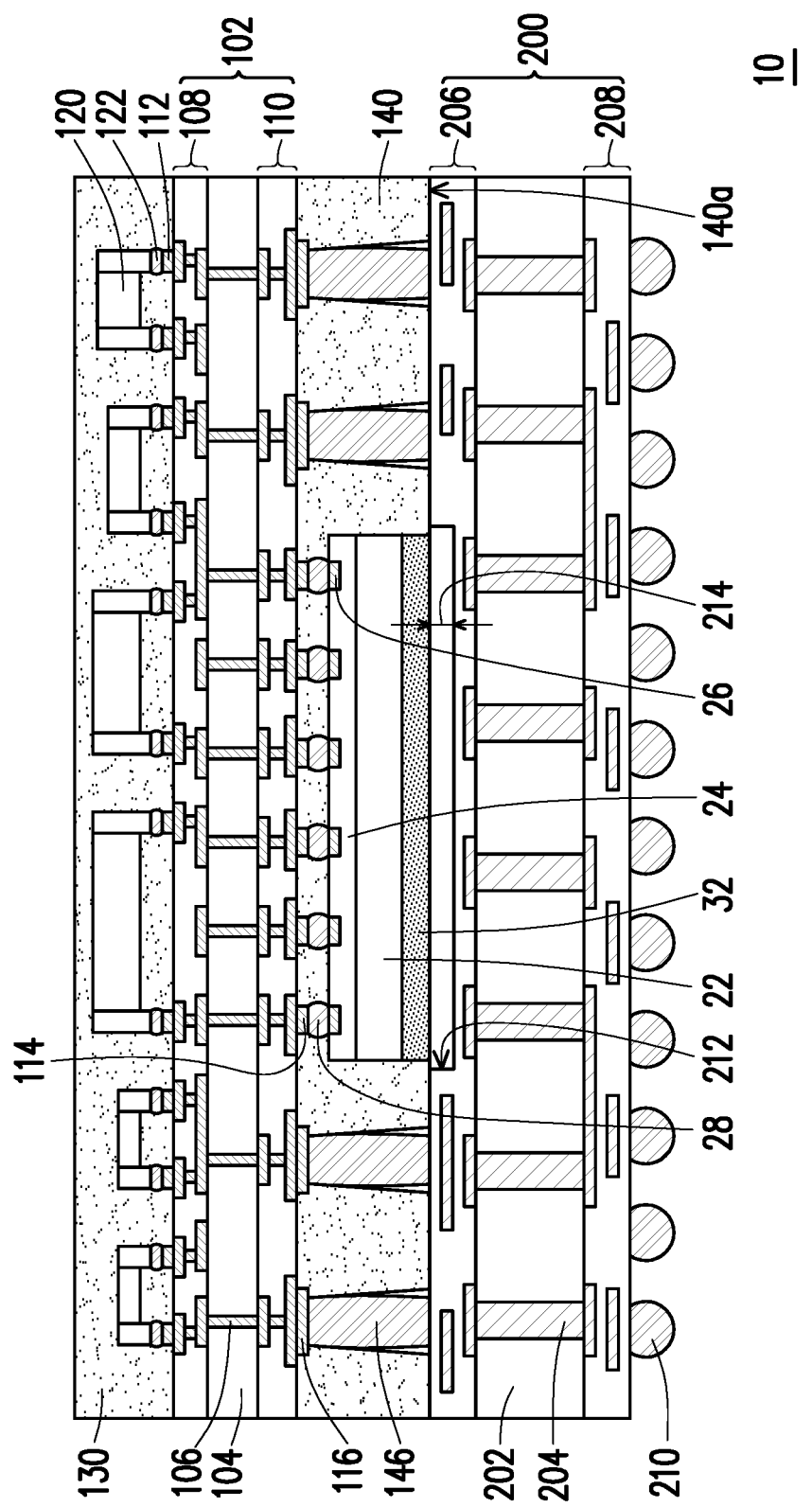
Figure 3:
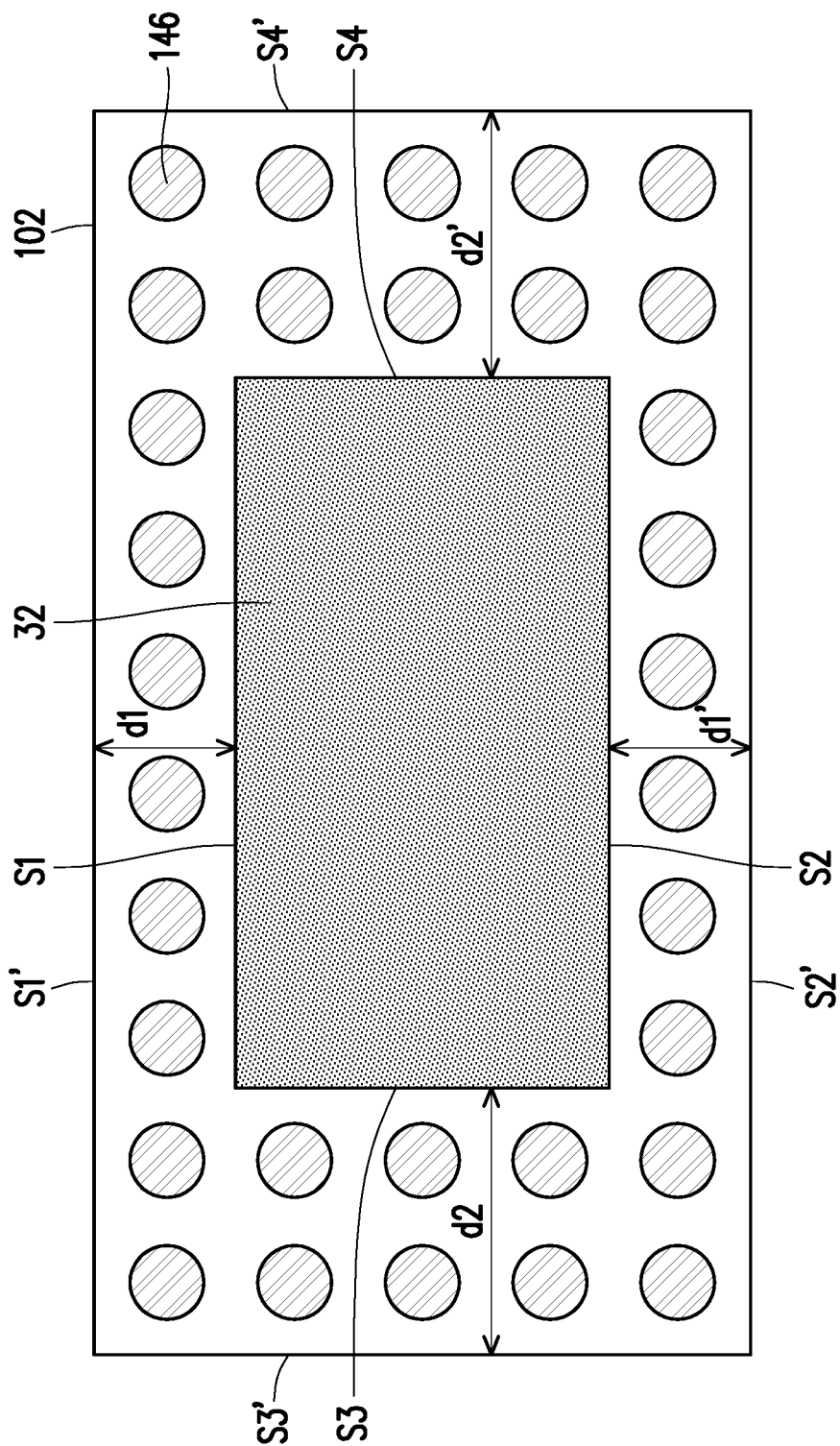
FIG. 3 is a schematic top view of a semiconductor package in accordance with some embodiments.

Referring to FIG. 2H, the structure of FIG. 2G is further attached to a board substrate 200, to form a semiconductor package 10. In some embodiments, the structure of FIG. 2G is bonded to the board substrate 200 through the electrical connectors 146. The board substrate 200 may be a packaging substrate, another die/wafer, a printed-circuit board, a high-density interconnect, or the like. The board substrate 200 may include a substrate 202, through vias 204, redistribution structures 206, 208 and electrical connectors 210. The through vias 204 penetrate the substrate 202. The redistribution structures 206, 208 are disposed on opposite sides of the substrate 202, and the redistribution structures 206, 208 are electrically connected to each other through the through vias 204. The electrical connectors 210 are disposed opposite to the interposer 102 with respect with the substrate 202 and may in turn be connected to another substrate (not shown).

In some embodiments, the board substrate 200 includes a cavity 212 such that the die 22 extends into the cavity 212 formed in the underlying board substrate 200. In some embodiments, a gap 214 is formed between the protective layer 32 and the board substrate 200. As a result of the cavity 212, the protective layer 32 is prevented from being in contact with the board substrate 200. In such embodiments, the size of the electrical connectors 146 is smaller than what would be possible using a substrate without a cavity, because the size of the electrical connectors 146 no longer needs to be greater than the total thickness of the die 22 and the protective layer 32. Accordingly, a thinner overall package may be possible. However, the disclosure is not limited thereto. In alternative embodiment, since the protective layer 32 is not conductive, the protective layer 32 is in contact with the board substrate 200, that is, the gap is not formed between the die 22 and the board substrate 200. In alternative embodiment in which the cavity is omitted, the electrical connectors 146 have a larger height to maintain a gap between the board substrate 200 and the die 22.

In some embodiments, during the thinning process, the surface 22b of the die 22 is protected by the protective layer 32 from being exposed and/or damaged. Accordingly, the formation of grinding marks on the die 22 caused by the thinning process is prevented, and the die strength is enhanced. Thus, when the thermal process such as reflow process is performed and/or external force is applied, the die 22 is prevented from being cracked.

Figure 4:
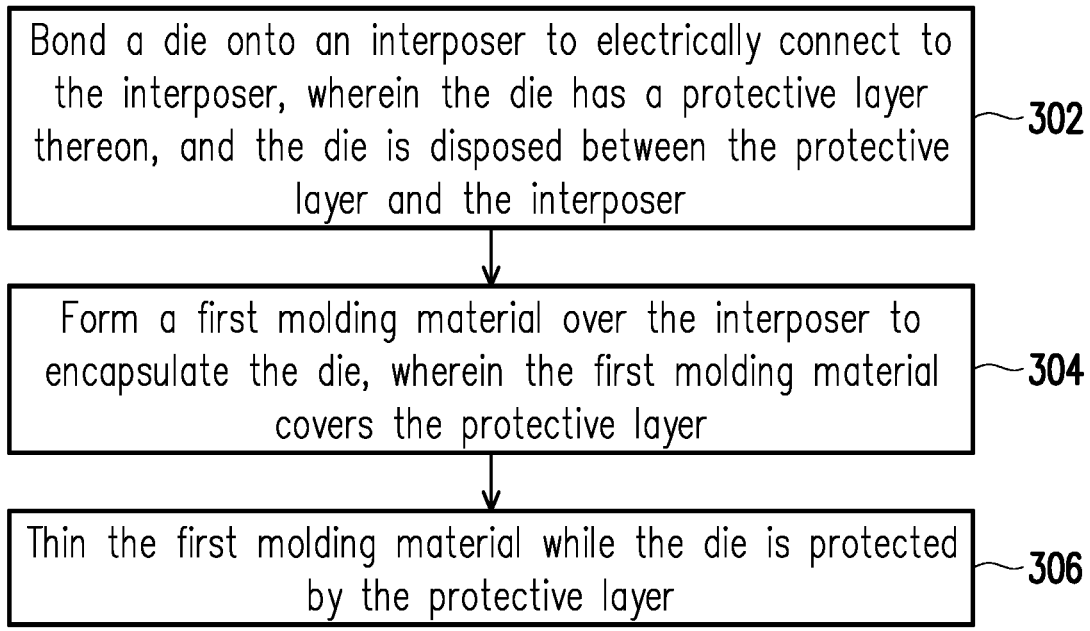
FIG. 4 illustrates a method of manufacturing a semiconductor package in accordance with some embodiments.

FIG. 4 illustrates a method of manufacturing a semiconductor package in accordance with some embodiments. Although the method is illustrated and/or described as a series of acts or events, it will be appreciated that the method is not limited to the illustrated ordering or acts. Thus, in some embodiments, the acts are carried out in different orders than illustrated, and/or are carried out concurrently. Further, in some embodiments, the illustrated acts or events are subdivided into multiple acts or events, which may be carried out at separate times or concurrently with other acts or sub-acts. In some embodiments, some illustrated acts or events are omitted, and other un-illustrated acts or events are included.

At act 302, a die is bonded onto an interposer to electrically connect to the interposer, wherein the die has a protective layer thereon, and the die is disposed between the protective layer and the interposer. FIG. 2A illustrates a cross-sectional view corresponding to some embodiments of act 302.

At act 304, a molding material is formed over the interposer to encapsulate the die, wherein the first molding material covers the protective layer. FIG. 2D illustrate cross-sectional views corresponding to some embodiments of act 304.

At act 306, the molding material is thinned while the die is protected by the protective layer. FIG. 2E illustrates a cross-sectional view corresponding to some embodiments of act 306.

At act 308, the interposer is bonded onto a board substrate, wherein the die is disposed between the interposer and the board substrate. FIG. 2H illustrates a cross-sectional view corresponding to some embodiments of act 308.

Figure 5:
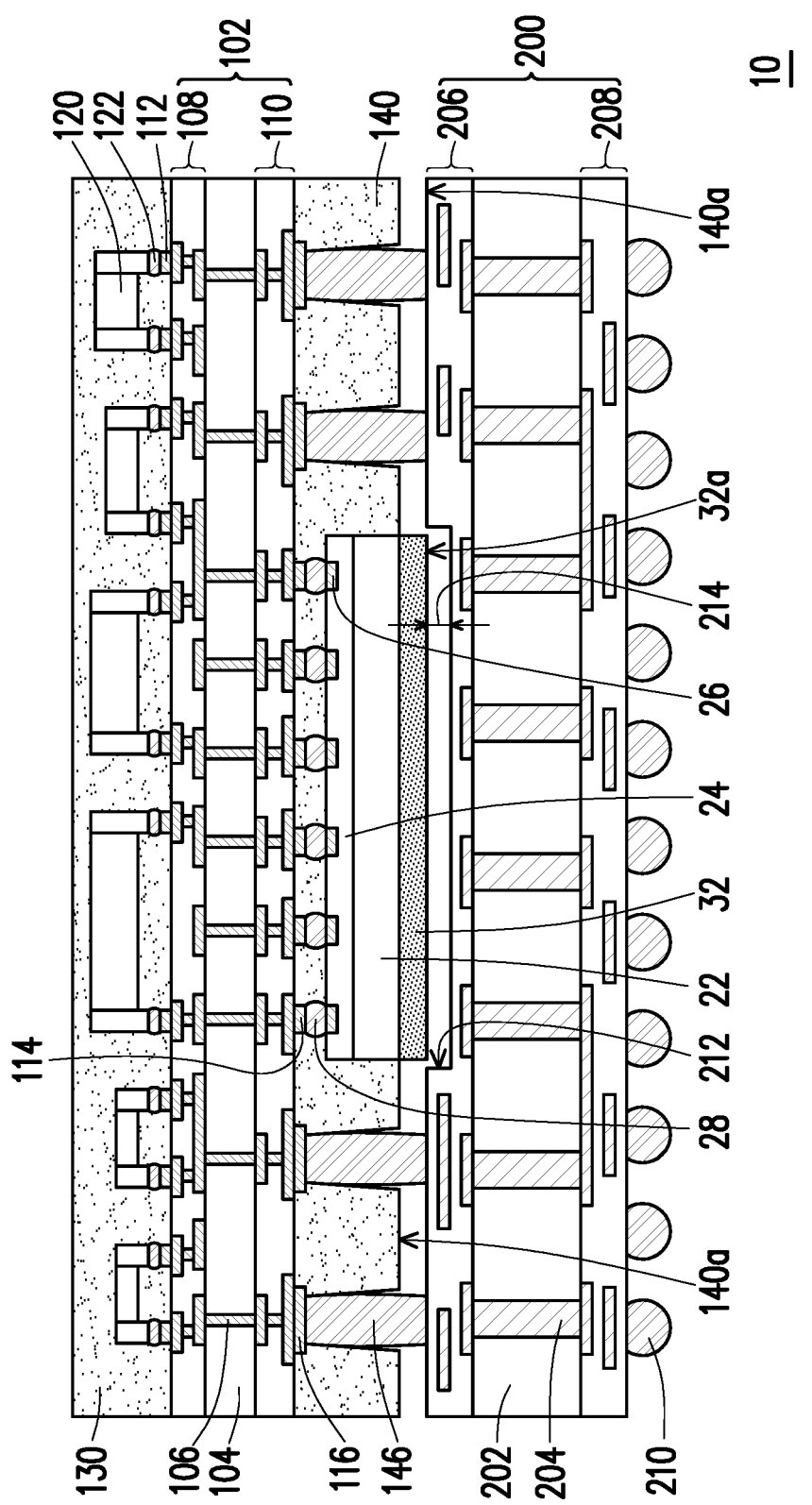
FIG. 5 is a schematic cross-sectional view a semiconductor package according to some embodiments.

The semiconductor package 10 of FIG. 5 may be similar to the semiconductor package 10 of FIG. 2H, and the difference between them lies in that, the protective layer 32 in FIG. 2C is formed before performing the thinning process on the molding material 140, while the protective layer 32 in FIG. 5 is formed after performing the thinning process on the molding material 140. In such embodiment, the molding material 140 is thinned until the surface 140a of the molding material 140 is substantially coplanar with the surface 22b of the die 22. After the thinning process, the protective layer 32 is formed on the surface 22b of the die 22. Thus, the surface 32a of the protective layer 32 is protruded from the surface 140a of the molding material 140. In such embodiment, the protective layer 32 is formed by a coating process, a lamination process, the like, or a combination thereof. In some embodiments, the protective layer 32 protects the die 22 from being cracked when the thermal process such as a reflow process is performed and/or external force is applied.

In some embodiments, the backside surface of the die is protected by the protective layer from being exposed and/or damaged. Accordingly, the formation of grinding marks on the die caused by the thinning process is prevented, and the die strength is enhanced. Thus, when the thermal process such as reflow process is performed and/or external force is applied, the die is prevented from being cracked. Therefore, the semiconductor package including the die may have good performance.

In accordance with some embodiments of the present disclosure, a semiconductor package includes an interposer, a die, a protective layer, a plurality of first electrical connectors and a first molding material. The die includes a first surface and a second surface opposite to the first surface, and the die is bonded to the interposer through the first surface. The protective layer is disposed on the second surface of the die. The first electrical connectors are disposed aside the die. The first molding material is disposed aside the die, the protection layer and the first electrical connectors.

In accordance with some embodiments of the present disclosure, a semiconductor package includes an interposer, a die and a board substrate. The die is bonded to and electrically connected to the interposer, and the die has a protective layer thereon. The interposer is bonded to and electrically connected to the board substrate, and the die is disposed between the interposer and the board substrate and electrically connected to the board substrate through the interposer.

In accordance with some embodiments of the present disclosure, a method of manufacturing a semiconductor package includes the following steps. A die is bonded onto an interposer to electrically connect to the interposer, wherein the die has a protective layer thereon, and the die is disposed between the protective layer and the interposer. A first molding material is formed over the interposer to encapsulate the die, wherein the first molding material covers the protective layer. The first molding material is thinned while the die is protected by the protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    an interposer;
    a die, comprising a first surface and a second surface opposite to the first surface, the die bonded to the interposer through the first surface;
    a protective layer, disposed on the second surface of the die, wherein an outer sidewall of the protective layer is substantially flush with an outer sidewall connecting to the first surface and the second surface of the die;
    a plurality of first electrical connectors aside the die; and
    a first molding material, disposed aside the die, the protection layer and the first electrical connectors.

2. The semiconductor package according to claim 1, wherein a surface of the first molding material is substantially coplanar with a surface of the protective layer.

3. The semiconductor package according to claim 1, wherein the protective layer is protruded from the first molding material.

4. The semiconductor package according to claim 1, wherein the first electrical connectors are protruded from the first molding material.

5. The semiconductor package according to claim 1, wherein a material of the protective layer is different from a material of the first molding material.

6. The semiconductor package according to claim 5 further comprising a second molding material encapsulating and covering the at least one surface mount device.

7. The semiconductor package according to claim 1 further comprising at least one surface mount device, wherein the at least one surface mount device is disposed opposite to the die with respect to the interposer.

8. The semiconductor package according to claim 1, wherein the die comprises a plurality of second electrical connectors on the first surface, and the die is bonded to and electrically connected to the interposer through the second electrical connectors.

9. The method according to claim 1, wherein a sidewall of the first molding material is substantially flush with a sidewall of the interposer.

10. A semiconductor package, comprising:
    an interposer;
    a die bonded to and electrically connected to the interposer, the die having a protective layer thereon; and
    a board substrate, wherein the interposer is bonded to and electrically connected to the board substrate, and the die is disposed between the interposer and the board substrate and electrically connected to the board substrate through the interposer, wherein the protective layer is disposed between the die and the board substrate, and the protective layer is separated from the board substrate by a gap.

11. The semiconductor package according to claim 10 further comprising at least one surface mount device, wherein the at least one surface mount device is disposed opposite to the die with respect to the interposer.

12. The semiconductor package according to claim 10 further comprising a first molding material encapsulating the die and a second molding material disposed opposite to the first molding material with respect to the interposer, wherein a sidewall of the first molding material is substantially flush with a sidewall of the second molding material.

13. The semiconductor package according to claim 10, wherein the die is disposed in a cavity of the board substrate without being in direct contact with the board substrate.

14. The semiconductor package according to claim 10, wherein a sidewall of the protective layer is substantially flush with a sidewall of the die.

15. The semiconductor package according to claim 10, wherein the die is bonded to the interposer through a plurality of first electrical connectors, the interposer is bonded to the board substrate through a plurality of second electrical connectors, and the second electrical connectors surround the first electrical connectors.

16. A method of manufacturing a semiconductor package, comprising:
    bonding a die onto an interposer to electrically connect to the interposer, wherein the die has a protective layer thereon, and the die is disposed between the protective layer and the interposer;
    forming a first molding material over the interposer to encapsulate the die, wherein the first molding material covers the protective layer; and
    thinning the first molding material while the die is protected by the protective layer.

17. The method according to claim 16, wherein a surface of the first molding material is substantially coplanar with a surface of the protective layer.

18. The method according to claim 16 further comprising forming a plurality of electrical connectors in the first molding material to surround the die.

19. The method according to claim 16 further comprising bonding the interposer onto a board substrate, wherein the die is disposed between the interposer and the board substrate.

20. The method according to claim 16 further comprising:
    bonding at least one surface mount device onto the interposer, wherein the at least one surface mount device is disposed opposite to the die with respect to the interposer; and
    forming a second molding material over the interposer to encapsulate the at least one surface mount device.

* * * * *